United States Patent
Yoo et al.

(10) Patent No.: US 11,923,343 B2
(45) Date of Patent: Mar. 5, 2024

(54) SEMICONDUCTOR PACKAGE AND METHOD OF FABRICATING THE SAME

(71) Applicant: Samsung Electronics Co., Ltd., Suwon-si (KR)

(72) Inventors: Jaekyung Yoo, Seoul (KR); Jayeon Lee, Seongnam-si (KR); Jae-eun Lee, Hwaseong-si (KR); Yeongkwon Ko, Hwaseong-si (KR); Jin-woo Park, Seoul (KR); Teak Hoon Lee, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 18/059,747

(22) Filed: Nov. 29, 2022

(65) Prior Publication Data
US 2023/0088032 A1   Mar. 23, 2023

Related U.S. Application Data

(63) Continuation of application No. 17/140,241, filed on Jan. 4, 2021, now Pat. No. 11,538,792.

(30) Foreign Application Priority Data

May 22, 2020   (KR) .................. 10-2020-0061467

(51) Int. Cl.
*H01L 25/065*   (2023.01)
*H01L 23/13*   (2006.01)
(Continued)

(52) U.S. Cl.
CPC .......... *H01L 25/0657* (2013.01); *H01L 23/13* (2013.01); *H01L 23/3157* (2013.01);
(Continued)

(58) Field of Classification Search
None
See application file for complete search history.

(56) References Cited

U.S. PATENT DOCUMENTS 5,710,071 A * 1/1998 Beddingfield ........ H01L 21/563
438/126
5,905,640 A * 5/1999 Hutchison .............. G11C 16/22
361/783

(Continued)

FOREIGN PATENT DOCUMENTS

| EP | 0575092 B1 | 8/1997 |
| JP | 2002-026046 A | 1/2002 |
| JP | 5566383 B2 | 8/2014 |

*Primary Examiner* — Long Pham
(74) *Attorney, Agent, or Firm* — Harness, Dickey & Pierce, P.L.C.

(57) ABSTRACT

Disclosed are semiconductor packages and/or methods of fabricating the same. The semiconductor package comprises a package substrate, a first semiconductor chip mounted on the package substrate, a second semiconductor chip mounted on a top surface of the first semiconductor chip, and a first under-fill layer that fills a space between the package substrate and the first semiconductor chip. The package substrate includes a cavity in the package substrate, and a first vent hole that extends from a top surface of the package substrate and is in fluid communication with the cavity. The first under-fill layer extends along the first vent hole to fill the cavity.

20 Claims, 16 Drawing Sheets

(51) Int. Cl.
*H01L 23/31* (2006.01)
*H01L 23/498* (2006.01)
*H01L 25/00* (2006.01)

(52) U.S. Cl.
CPC .. *H01L 23/49822* (2013.01); *H01L 23/49838* (2013.01); *H01L 25/50* (2013.01); *H01L 2225/06513* (2013.01); *H01L 2225/06541* (2013.01); *H01L 2225/06586* (2013.01)

(56) References Cited

U.S. PATENT DOCUMENTS

| | | | |
|---|---|---|---|
| 6,153,939 A | 11/2000 | Wang et al. | |
| 6,490,166 B1 | 12/2002 | Ramalingam et al. | |
| 6,987,058 B2* | 1/2006 | Hall | H01L 23/24 |
| | | | 174/390 |
| 11,296,051 B2* | 4/2022 | Kao | H01L 24/20 |
| 11,302,675 B2* | 4/2022 | Maeda | H01L 25/50 |
| 2007/0272436 A1 | 11/2007 | Matsui | |

* cited by examiner

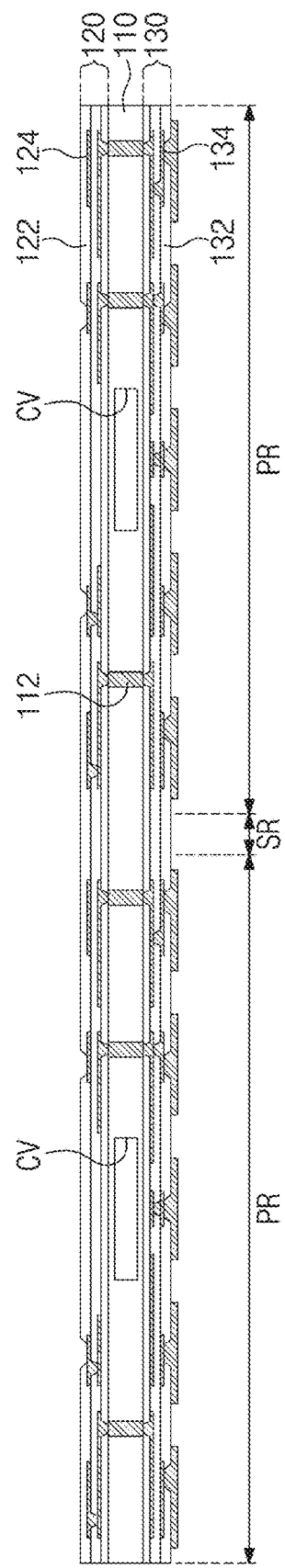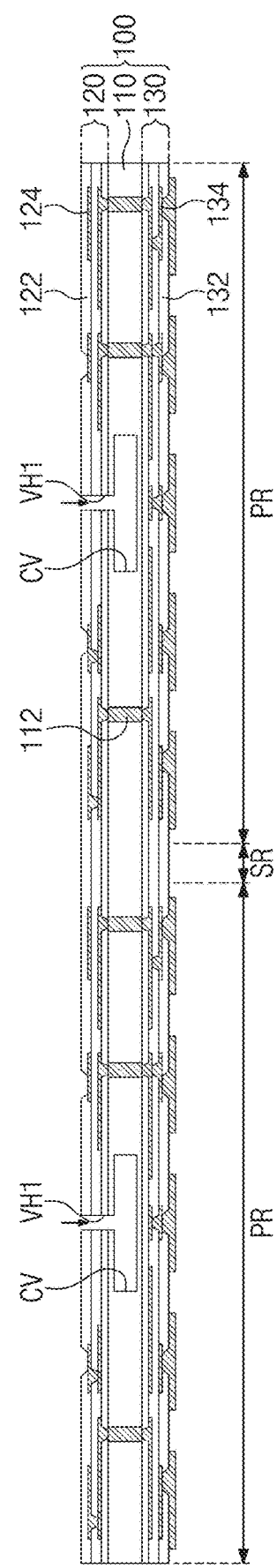

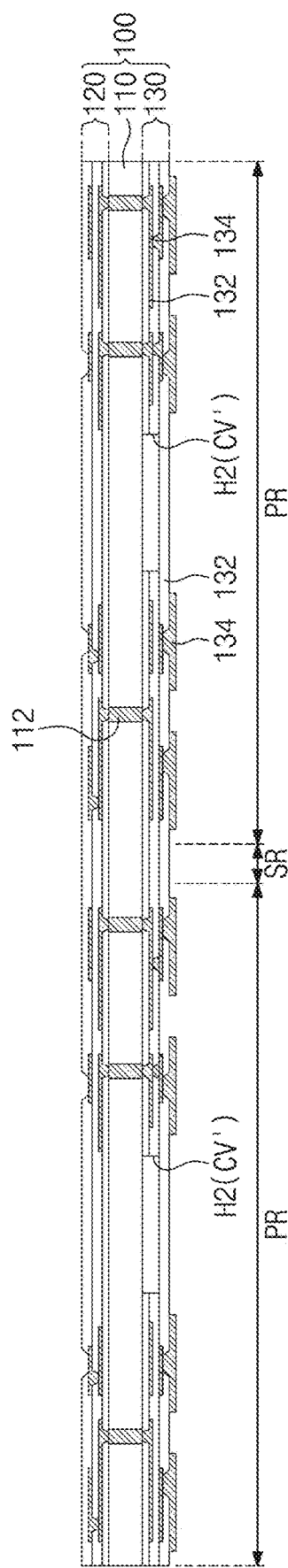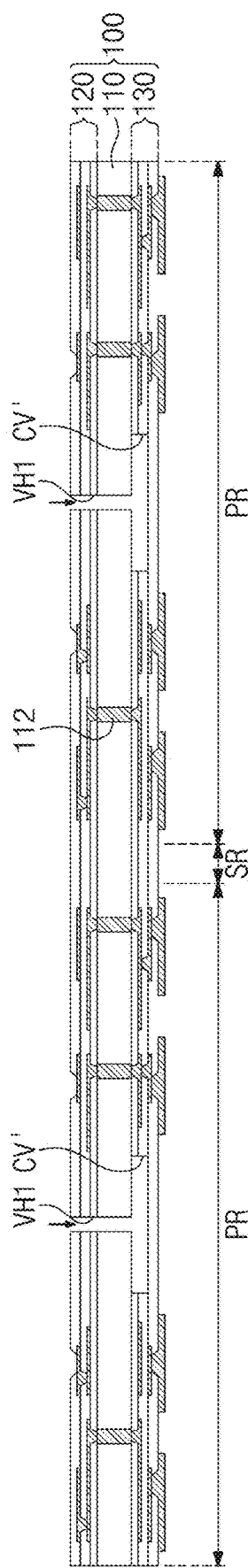

SEMICONDUCTOR PACKAGE AND METHOD OF FABRICATING THE SAME

CROSS-REFERENCE TO RELATED APPLICATION

This application is a continuation of U.S. patent application Ser. No. 17/140,241, filed on Jan. 4, 2021, which is based on and claims priority under 35 U.S.C § 119 to Korean Patent Application No. 10-2020-0061467 filed on May 22, 2020 the Korean Intellectual Property Office, the disclosures of each of which are hereby incorporated by reference in their entirety.

BACKGROUND

Inventive concepts relate to a semiconductor package and/or a method of fabricating the same, and more particularly, to a stacked semiconductor package and/or a method of fabricating the same.

With the development of the electronic industry, electronic products have increasing demands for high performance, high speed, and compact size. To meet the trend, packaging technology recently has been developed where a plurality of semiconductor chips are mounted in a single package.

Portable devices have been increasingly demanded in recent electronic product markets, and as a result, reducing the size and weight of electronic parts mounted on portable devices has been desired. To accomplish the reduction in size and weight of the electronic parts, technology is desired not only to reduce the size of mounting parts, but also to integrate a number of individual devices on a single package.

SUMMARY

Some example embodiments of inventive concepts provide a compact-sized semiconductor package and/or a method of fabricating the same.

Some example embodiments of inventive concepts provide a semiconductor package with improved structural stability and/or a method of fabricating the same.

Some example embodiments of inventive concepts provide a method of fabricating a semiconductor package, which method reduces the occurrence of defects.

Features and effects of inventive concepts are not limited to the mentioned above, and other features and effects that have not been mentioned above will be clearly understood to those skilled in the art from the following description.

According to some example embodiments of inventive concepts, a semiconductor package may include a package substrate; a first semiconductor chip mounted on the package substrate; a second semiconductor chip mounted on a top surface of the first semiconductor chip; and a first under-fill layer that fills a space between the package substrate and the first semiconductor chip. The package substrate may include a cavity in the package substrate and a first vent hole. The first vent hole may extend from a top surface of the package substrate to the cavity and may be in fluid communication with the cavity. The first under-fill layer may extend along the first vent hole to fill the cavity.

According to some example embodiments of inventive concepts, a semiconductor package may include a package substrate including a cavity therein; a first semiconductor chip mounted through a first chip terminal on the package substrate; a second semiconductor chip mounted through a second chip terminal on a top surface of the first semiconductor chip; a first under-fill layer filling the cavity and a space between the package substrate and the first semiconductor chip; a second under-fill layer filling a space between the first semiconductor chip and the second semiconductor chip; and a molding layer on the package substrate. The molding layer may surround the first semiconductor chip and the second semiconductor chip. A width of the first under-fill layer between the package substrate and the first semiconductor chip may be less than a width of the second under-fill layer between the first semiconductor chip and the second semiconductor chip.

According to some example embodiments of inventive concepts, a method of fabricating a semiconductor package may include providing a package substrate including a cavity therein and a first vent hole that extends from a top surface of the package substrate and is fluid communication with the cavity; forming a first under-fill layer on the package substrate; providing a first semiconductor chip on the first under-fill layer to mount the first semiconductor chip on the package substrate; forming a second under-fill layer on the first semiconductor chip; and providing a second semiconductor chip on the second under-fill layer to mount the second semiconductor chip on the first semiconductor chip. When the first semiconductor chip is mounted, the first under-fill layer may be introduced through the first vent hole into the cavity. When the second semiconductor chip is mounted, the second under-fill layer may protrude from a side of the second semiconductor chip.

BRIEF DESCRIPTION OF THE DRAWINGS

FIGS. 9 to 18 illustrate cross-sectional views showing a method of fabricating a semiconductor package according to some example embodiments of inventive concepts.

FIGS. 19 to 22 illustrate cross-sectional views showing a method of fabricating a semiconductor package according to some example embodiments of inventive concepts.

DETAILED DESCRIPTION OF EMBODIMENTS

The following will now describe a semiconductor package according to inventive concepts with reference to the accompanying drawings.

Figure 1:
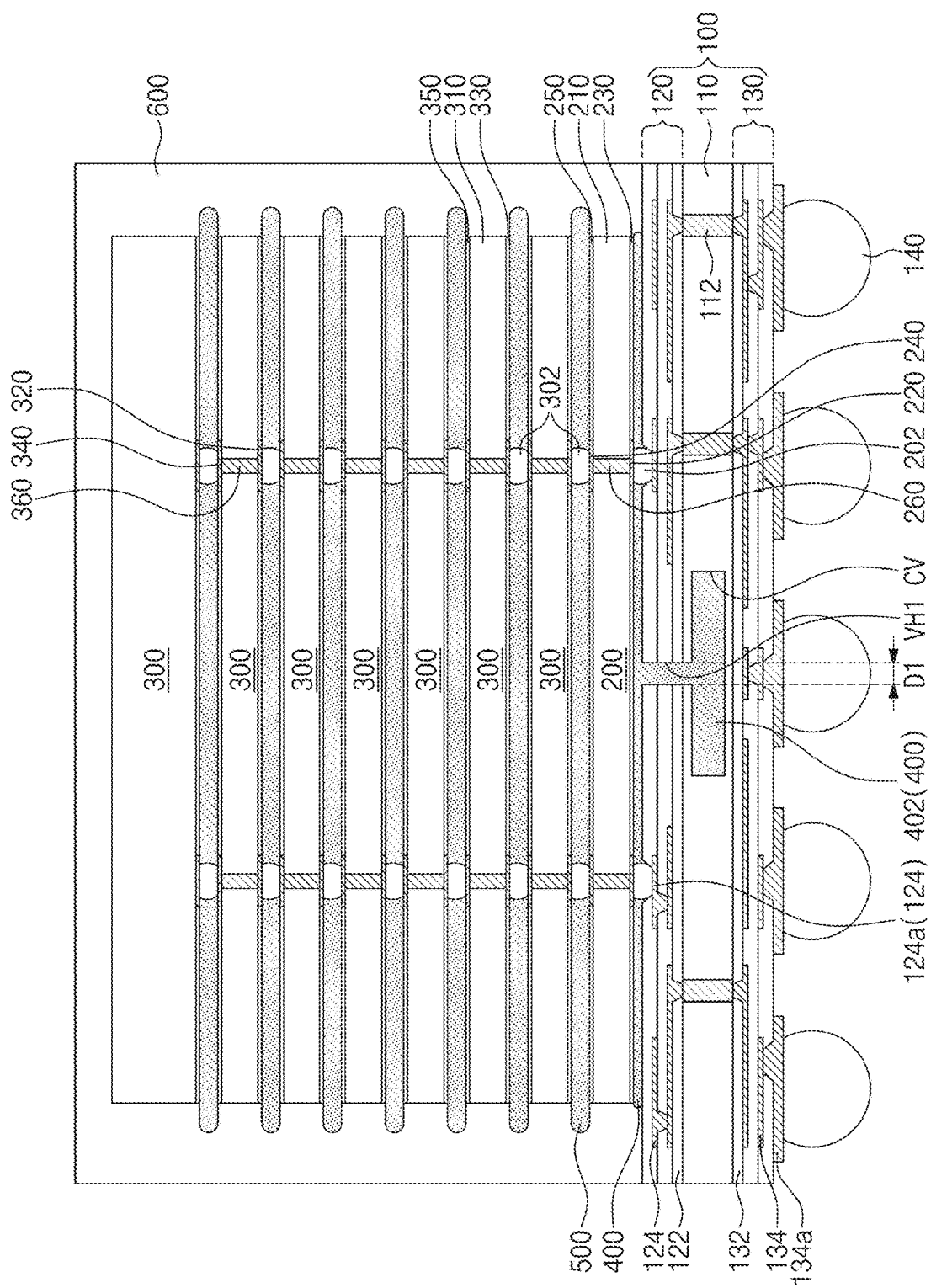
FIG. 1 illustrates a cross-sectional view showing a semiconductor package according to some example embodiments of inventive concepts.
Figure 2:
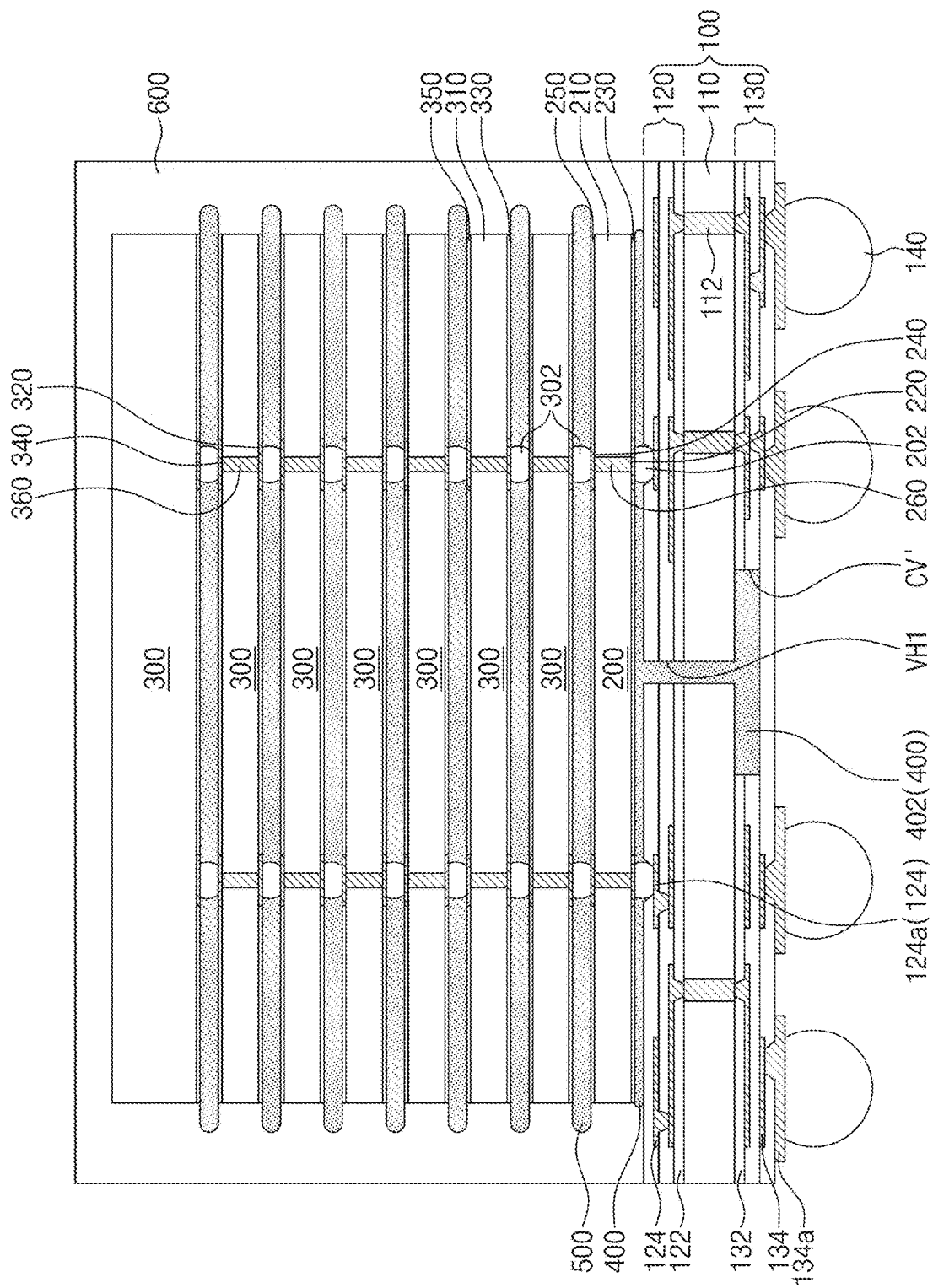
FIG. 2 illustrates a cross-sectional view showing a semiconductor package according to some example embodiments of inventive concepts.

FIG. 1 illustrates a cross-sectional view showing a semiconductor package according to some example embodiments of inventive concepts. FIG. 2 illustrates a cross-sectional view showing a semiconductor package according to some example embodiments of inventive concepts.

Referring to FIG. 1, a package substrate 100 may be provided. The package substrate 100 may include a core portion 110, an upper buildup portion 120 disposed on a top surface of the core portion 110, and a lower buildup portion 130 disposed on a bottom surface of the core portion 110.

The core portion 110 may extend in one direction. When viewed in plan, the core portion 110 may include one core pattern. In some example embodiments of inventive concepts, the core portion 110 is illustrated by way of example to have one core pattern, but inventive concepts are not limited thereto. According to some example embodiments, the core portion 110 may include two or more core patterns. For example, the package substrate 100 may include a plurality of core patterns that are spaced apart from each other when viewed in plan. The core portion 110 may include a dielectric material. For example, the core portion 110 may include one of glass fibers, ceramic plates, epoxy, and resins. For another example, the core portion 110 may include one selected from stainless steel, aluminum (Al), nickel (Ni), magnesium (Mg), zinc (Zn), tantalum (Ta), and any combination thereof.

The core portion 110 may have vertical connection terminals 112 that vertically penetrate the core portion 110. The vertical connection terminals 112 may electrically connect the upper buildup portion 120 to the lower buildup portion 130.

The upper and lower buildup portions 120 and 130 may be respectively disposed on the top and bottom surfaces of the core portion 110.

The upper buildup portion 120 may cover the top surface of the core portion 110. The upper buildup portion 120 may include a plurality of upper dielectric layers 122 and a plurality of upper wiring lines 124 that are alternately stacked on the top surface of the core portion 110. An uppermost one of the upper dielectric layers 122 may expose ones of the upper wiring lines 124, and the exposed upper wiring lines 124 may correspond to first substrate pads 124a through which the package substrate 100 is mounted thereon with semiconductor chips 200 and 300 which will be discussed below. For example, the uppermost one of the upper dielectric layers 122 may include recessions, and the first substrate pads 124a may be exposed to the recessions.

The lower buildup portion 130 may cover the bottom surface of the core portion 110. The lower buildup portion 130 may include a plurality of lower dielectric layers 132 and a plurality of lower wiring lines 134 that are alternately stacked on the bottom surface of the core portion 110.

The upper and lower dielectric layers 122 and 132 may include prepreg, Ajinomoto build-up films (ABF), FR-4, or bismaleimide triazine (BT). The upper and lower wiring lines 124 and 134 may include a circuit pattern. The lower wiring line 134 may be electrically connected through the vertical connection terminal 112 to the upper wiring line 124. The upper and lower wiring lines 124 and 134 may include one of copper (Cu), aluminum (Al), silver (Ag), tin (Sn), gold (Au), nickel (Ni), lead (Pb), titanium (Ti), and any combination thereof.

The package substrate 100 may have a cavity CV and a first vent hole VH1.

The cavity CV may be a recess where the core portion 110 is partially removed from the package substrate 100. The cavity CV may be positioned inside the core portion 110. For example, the cavity CV may be defined to indicate a region in which the core portion 110 is partially removed and which is surrounded by the core portion 110. When viewed in plan, the cavity CV may be placed on a central part of the package substrate 100. For example, the cavity CV may be disposed between the vertical connection terminals 112.

According to some example embodiments, the cavity CV may be a region in which one of the upper and lower buildup portions 120 and 130 is partially removed. For example, as shown in FIG. 2, the core portion 110 may have therebelow a cavity CV' that is formed by partially removing the lower buildup portion 130. For example, the cavity CV' may be defined to indicate a region in which the lower buildup portion 130 is partially removed and which is surrounded by the core portion 110 and the lower buildup portion 130. Differently from that shown in FIG. 2, the cavity CV may be a region in which the upper buildup portion 120 is partially removed.

According to some example embodiments, the cavity CV may be a region in which are partially removed the core portion 110, the upper buildup portion 120, and the lower buildup portion 130. For example, the cavity CV may be defined to indicate a region in which each of the core portion 110, the upper buildup portion 120, and the lower buildup portion 130 is partially removed and which is surrounded by the core portion 110, the upper buildup portion 120, and the lower buildup portion 130.

Referring back to FIG. 1, the first vent hole VH1 may be formed on an upper part of the package substrate 100. When viewed in plan, the first vent hole VH1 may be disposed on the central part of the package substrate 100. For example, the first vent hole VH1 may be positioned between the recessions formed in the upper dielectric layer 122 of the upper buildup portion 120. The first vent hole VH1 may be placed above the cavity CV. The first vent hole VH1 may extend from the cavity CV toward a top surface of the package substrate 100. For example, the first vent hole VH1 may be formed to penetrate the upper buildup portion 120 and a portion of the core portion 110. The cavity CV may be spatially connected (e.g., in fluid communication) to outside through the first vent hole VH1. The first vent hole VH1 may have a width D1 of about 2 μm to about 10 μm. The first vent hole VH1 may have an aspect ratio of about 0.1 to about 2.0. The aspect ratio and the width D1 of the first vent hole VH1 may depend on a material of a molding layer 600 which will be discussed below. FIG. 1 depicts an example that includes one first vent hole VH1, but inventive concepts are not limited thereto.

Figure 3:
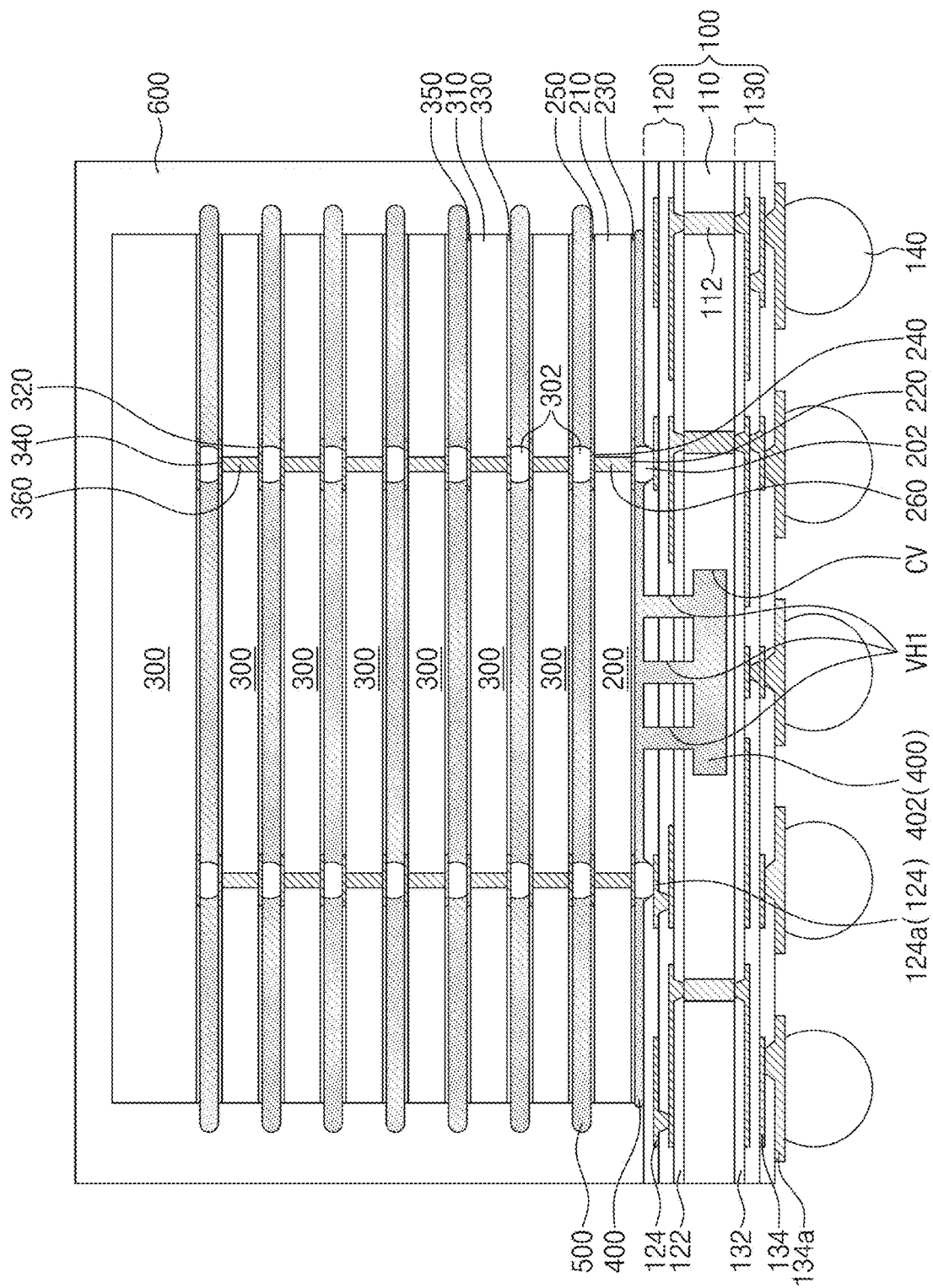
FIG. 3 illustrates a cross-sectional view showing a semiconductor package according to some example embodiments of inventive concepts.
Figure 4:
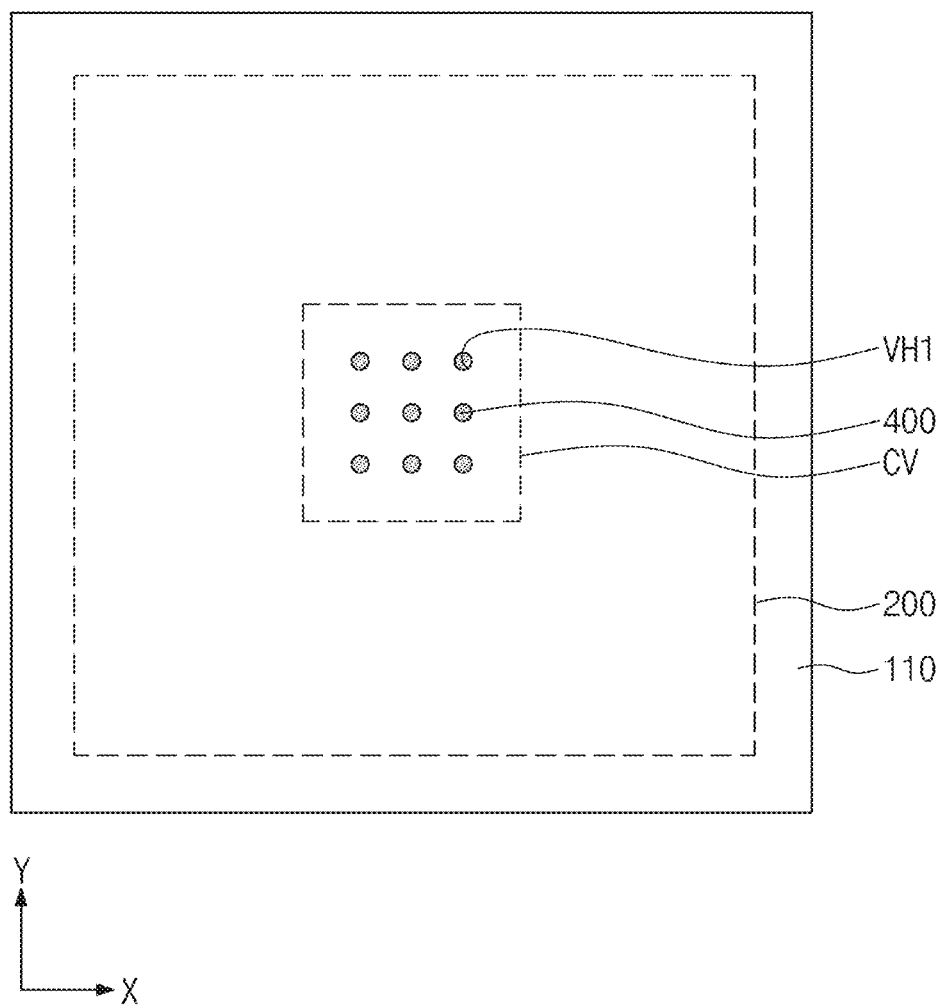
FIGS. 4 and 5 illustrate plan views showing a semiconductor package according to some example embodiments of inventive concepts.
Figure 5:
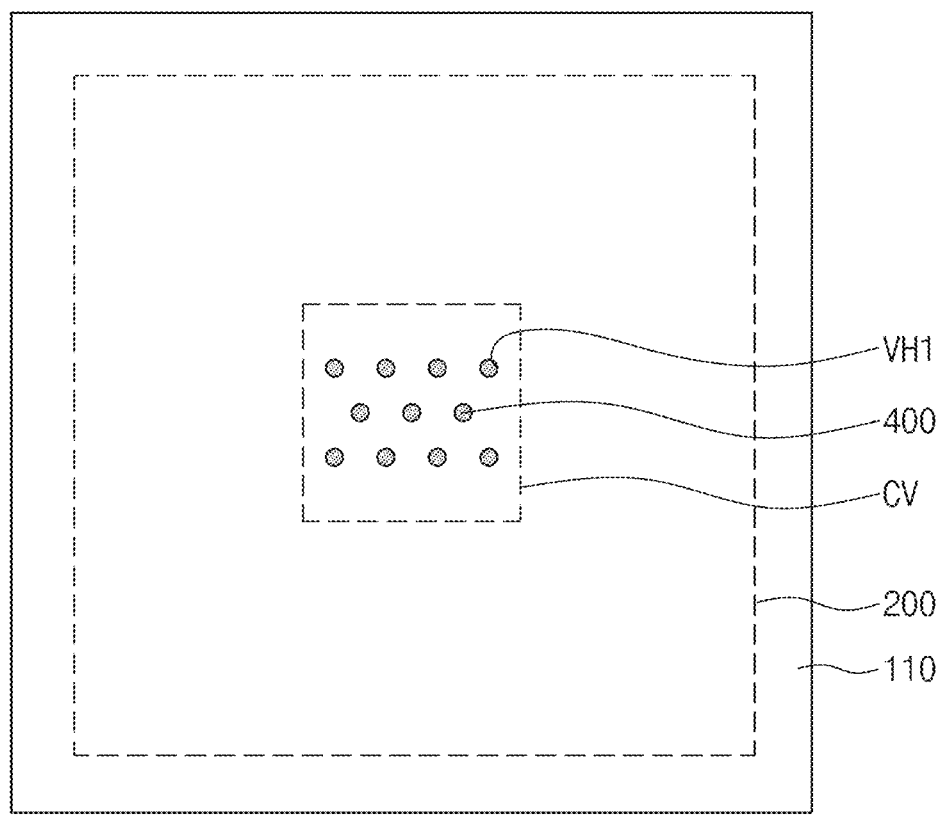

The first vent hole VH1 may be provided in plural as shown in FIG. 3 below. FIG. 3 illustrates a cross-sectional view showing a semiconductor package according to some example embodiments of inventive concepts. FIGS. 4 and 5 illustrate plan views showing a semiconductor package according to some example embodiments of inventive concepts. As shown in FIG. 3, each of the plurality of first vent holes VH1 may penetrate the upper buildup portion 120 and a portion of the core portion 110, thereby being spatially connected to the cavity CV. The first vent holes VH1 may be disposed spaced apart from each other When viewed in plan, the first vent holes VH1 may be arranged at a regular interval. The first vent holes VH1 may be arranged along a first direction X and a second direction Y that are parallel to the top surface of the package substrate 100. In this case, the first vent holes VH1 may constitute a plurality of columns and rows when viewed in plan. For example, as shown in FIG. 4, the first direction X and the second direction Y may be orthogonal to each other, and the first vent holes VH1 may be arranged in a tetragonal lattice shape. For another example, as shown in FIG. 5, the first direction X and the second direction Y may intersect each other at an angle of about 60°, and the first vent holes VH1 may be arranged in a hexagonal lattice shape. Inventive concepts, however, are not limited thereto, and the first vent holes VH1 may be arranged in various shapes.

Referring again to FIG. 1, external terminals 140 may be disposed below the lower buildup portion 130. The external terminals 140 may be provided on a bottom surface of the lower buildup portion 130. For example, the external terminals 140 may be placed on second substrate pads 134a provided on the bottom surface of the lower buildup portion 130. In this case, the second substrate pads 134a may be either ones of the lower wiring lines 134 exposed from the lower dielectric layer 132 of the lower buildup portion 130 or separate pads that are disposed on the lower dielectric layer 132 of the lower buildup portion 130 and are connected to the lower wiring line 134. The external terminals 140 may include a solder ball or a solder bump.

A first semiconductor chip 200 may be mounted on the package substrate 100. The first semiconductor chip 200 may be a memory chip or a logic chip. The first semiconductor chip 200 may include a semiconductor material, such as silicon (Si). The first semiconductor chip 200 may have a front surface and a rear surface. In this description, the language "front surface" may be defined to indicate an active surface of an integrated device in a semiconductor chip or a surface on which are formed pads of a semiconductor chip, and the language "rear surface" may be defined to indicate a surface opposite to the front surface. The first semiconductor chip 200 may include a first base layer 210, first chip pads 220 disposed on the front surface of the first semiconductor chip 200, a first lower passivation layer 230 that covers the front surface of the first semiconductor chip 200, second chip pads 240 disposed on the rear surface of the first semiconductor chip 200, and a first upper passivation layer 250 that covers the rear surface of the first semiconductor chip 200.

The first chip pads 220 may be electrically connected to an integrated device or integrated circuits in the first semiconductor chip 200. According to some example embodiments, redistribution lines may be provided between the first chip pads 220 and the integrated device in the first semiconductor chip 200. The second chip pads 240 may be electrically connected to the first chip pads 220 through first through electrodes 260 that vertically penetrate the first base layer 210. Alternatively, the second chip pads 240 may be connected through the first through electrodes 260 to separate wiring lines that are electrically floated from the integrated device in the first semiconductor chip 200. The first and second chip pads 220 and 240 may include a conductive material, such as metal. For example, the first and second chip pads 220 and 240 may include copper (Cu).

The first chip pads 220 may be surrounded by the first lower passivation layer 230 on the front surface of the first semiconductor chip 200. For example, the first lower passivation layer 230 may cover a bottom surface of the first base layer 210 and may contact lateral surfaces of the first chip pads 220. The first lower passivation layer 230 may have a lowermost end at the same level as that of bottom surfaces of the first chip pads 220. The second chip pads 240 may be surrounded by the first upper passivation layer 250 on the rear surface of the first semiconductor chip 200. For example, the first upper passivation layer 250 may cover a top surface of the first base layer 210 and may contact lateral surfaces of the second chip pads 240. The first upper passivation layer 250 may have a lowermost end at the same level as that of bottom surfaces of the second chip pads 240. The first lower passivation layer 230 and the first upper passivation layer 250 may include oxide or nitride. For example, the first lower passivation layer 230 and the first upper passivation layer 250 may include silicon oxide (SiO), silicon nitride (SiN), or silicon carbonitride (SiCN).

The first semiconductor chip 200 may vertically overlap the cavity CV. For example, the cavity CV and the first vent hole VH1 may be positioned below a central part of the first semiconductor chip 200. The first semiconductor chip 200 may have a width greater than that of the cavity CV. For example, the width of the cavity CV may be about ⅕ to about ½ of the width of the first semiconductor chip 200.

The first semiconductor chip 200 may be mounted on the package substrate 100. The front surface of the first semiconductor chip 200 may be directed toward the package substrate 100, and the first semiconductor chip 200 may be flip-chip mounted on the package substrate 100. For example, first connection terminals 202 may be provided on the first chip pads 220 of the first semiconductor chip 200, and the first connection terminals 202 may be coupled to the first substrate pads 124a of the package substrate 100. The first connection terminals 202 may include a solder ball or a solder bump.

A first under-fill layer 400 may be interposed between the package substrate 100 and the first semiconductor chip 200. The first under-fill layer 400 may fill a space between the package substrate 100 and the first semiconductor chip 200 and may surround the first connection terminals 202. The first under-fill layer 400 may be formed either of a molding member or of a flux containing a resin, an activator, and a solvent. The solvent may include a glycol ether ester compound, a glycol ether compound, an ester compound, a ketone compound, or a cyclic ester compound. Alternatively, the first under-fill layer 400 may include a non-conductive film (NCF), such as an Ajinomoto build-up film (ABF). The first under-fill layer 400 may protrude outwardly from a lateral surface of the first semiconductor chip 200. For example, the first under-fill layer 400 may have a width greater than that of the first semiconductor chip 200.

The first under-fill layer 400 may fill the cavity CV of the package substrate 100. For example, the first under-fill layer 400 may have a first extension 402 that extends along the first vent hole VH1 and projects into the cavity CV from a space between the package substrate 100 and the first semiconductor chip 200. The first extension 402 of the first under-fill layer 400 may fill both the first vent hole VH1 and the cavity CV.

Second semiconductor chips 300 may be stacked on the first semiconductor chip 200. The second semiconductor chips 300 may be memory chips. The second semiconductor chips 300 may be substantially identical or similar to the first semiconductor chip 200. Alternatively, the second semiconductor chips 300 may be of a different type from the first semiconductor chip 200. Each of the second semiconductor chips 300 may include a second base layer 310, third chip pads 320 disposed on a front surface of the second semiconductor chip 300, a second lower passivation layer 330 that covers the front surface of the second semiconductor chip 300, fourth chip pads 340 disposed on a rear surface of the second semiconductor chip 300, a second upper passivation layer 350 that covers the rear surface of the second semiconductor chip 300, and second through electrodes 360 that connect the third chip pads 320 to the fourth chip pads 340.

A lowermost one of the second semiconductor chips 300 may be mounted on the first semiconductor chip 200. The front surface of the lowermost second semiconductor chip 300 may be directed toward the first semiconductor chip 200, and the lowermost second semiconductor chip 300 may be flip-chip mounted on the first semiconductor chip 200. For example, second connection terminals 302 may be provided on the third chip pads 320 of the lowermost second semiconductor chip 300, and the second connection terminals 302 may be coupled to the second chip pads 240 of the first semiconductor chip 200. The second connection terminals 302 may include a solder ball or a solder bump. A distance between the first semiconductor chip 200 and the lowermost second semiconductor chip 300 may be greater than a distance between the first semiconductor chip 200 and the package substrate 100. According to some example embodiments of inventive concepts, because a small distance is provided between the first semiconductor chip 200 and the package substrate 100, it may be possible to provide a semiconductor package whose height is small and whose size is compact.

In addition, the second semiconductor chips 300 may each be mounted on another underlying second semiconductor chip 300 thereunder. For example, the second semiconductor chips 300 may each be mounted through the second connection terminals 302 on the fourth chip pads 340 of its underlying second semiconductor chip 300. A distance between the second semiconductor chips 300 may be substantially the same as a distance between the first semiconductor chip 200 and the lowermost second semiconductor chip 300 and greater than a distance between the package substrate 100 and the first semiconductor chip 200.

According to some example embodiments, an uppermost one of the second semiconductor chips 300 may not include the fourth chip pads 340, the second upper passivation layer 350, or the second through electrodes 360. Alternatively, differently from that shown, the uppermost second semiconductor chip 300 may be the same as other second semiconductor chips 300, and may include the fourth chip pads 340, the second upper passivation layer 350, and the second through electrodes 360.

Second under-fill layers 500 may be interposed between the second semiconductor chips 300 and between the first semiconductor chip 200 and the lowermost second semiconductor chip 300. The second under-fill layers 500 may fill a space between the first semiconductor chip 200 and the lowermost second semiconductor chip 300 and spaces between the second semiconductor chips 300, and may surround the second connection terminals 302. The second under-fill layer 500 may be formed either of a molding member or a flux containing a resin, an activator, and a solvent. Alternatively, the second under-fill layers 500 may include a non-conductive film (NCF), such as an Ajinomoto build-up film (ABF). The second under-fill layer 500 may protrude outwardly from a lateral surface of the second semiconductor chip 300. For example, the second under-fill layer 500 may have a width greater than that of the second semiconductor chip 300. In addition, the width of the second under-fill layer 500 may be greater than the width of the first under-fill layer 400.

A molding layer 600 may be provided on the package substrate 100. The molding layer 600 may cove the top surface of the package substrate 100. The molding layer 600 may surround the first semiconductor chip 200 and the second semiconductor chips 300. For example, the molding layer 600 may cover the lateral surface of the first semiconductor chip 200 and the lateral surfaces of the second semiconductor chips 300. In this case, a distance between an outer surface of the molding layer 600 and a distal end of the first under-fill layer 400 may be greater than distances between the outer surface of the molding layer 600 and distal ends of the second under-fill layers 500. The distance between the outer surface of the molding layer 600 and the distal end of the first under-fill layer 400 may range from about 100 µm to about 500 µm. The molding layer 600 may protect the first semiconductor chip 200 and the second semiconductor chips 300. The molding layer 600 may include a dielectric material. For example, the molding layer 600 may include an epoxy molding compound (EMC). The molding layer 600 may be formed to cover the first semiconductor chip 200 and the second semiconductor chips 300. For example, the molding layer 600 may cover the rear surface of the uppermost second semiconductor chip 300. Alternatively, differently from that shown, the molding layer 600 may expose the rear surface of the uppermost second semiconductor chip 300.

According to some example embodiments of inventive concepts, a small width may be provided to the first under-fill layer 400, and a large contact area may be provided between the molding layer 600 and the package substrate 100. Accordingly, the molding layer 600 and the package substrate 100 may have a strong adhesive force therebetween, and a semiconductor package may increase in structural stability.

Figure 6:
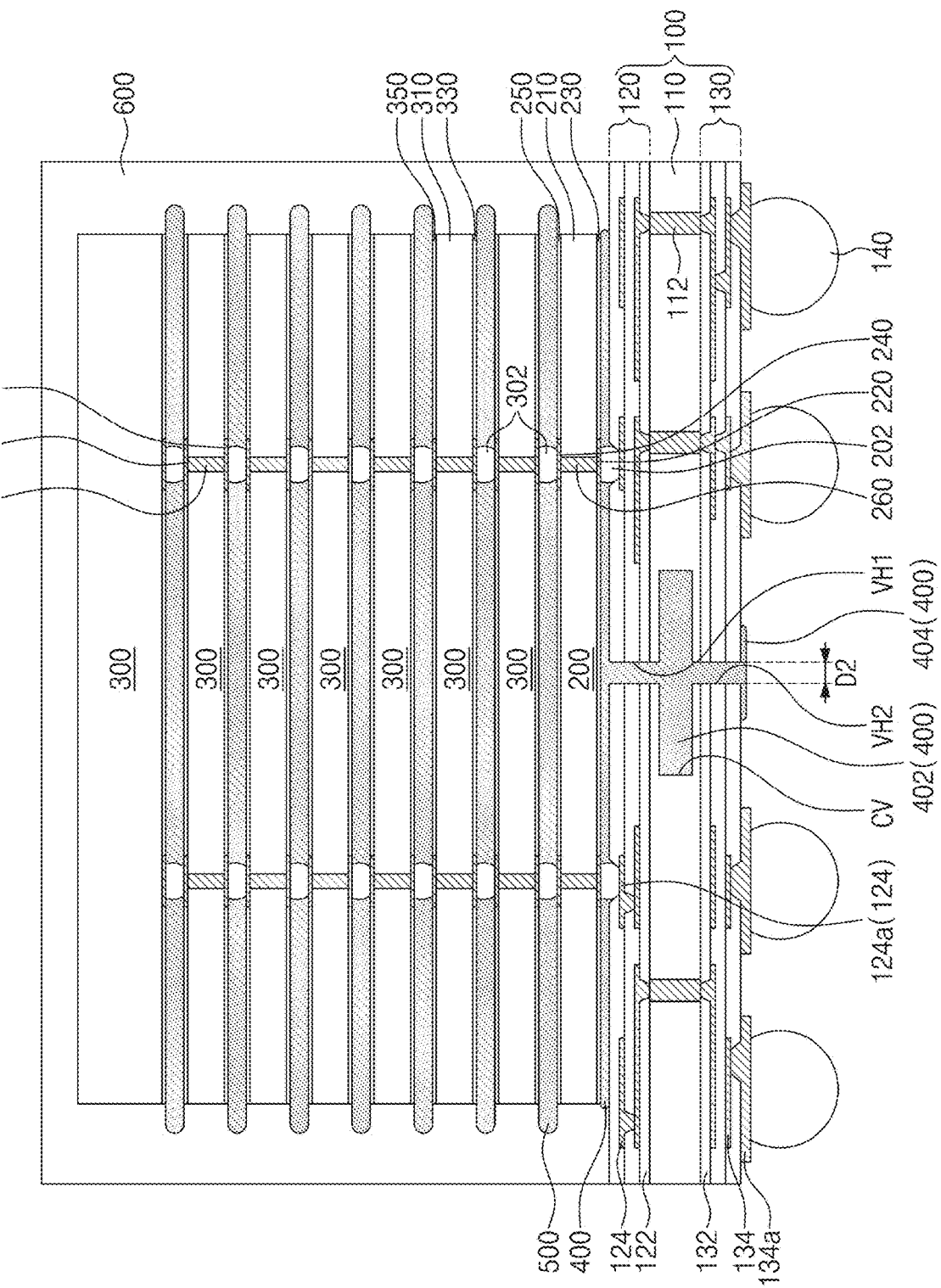
FIGS. 6 and 7 illustrate cross-sectional views showing a semiconductor package according to some example embodiments of inventive concepts.
Figure 7:
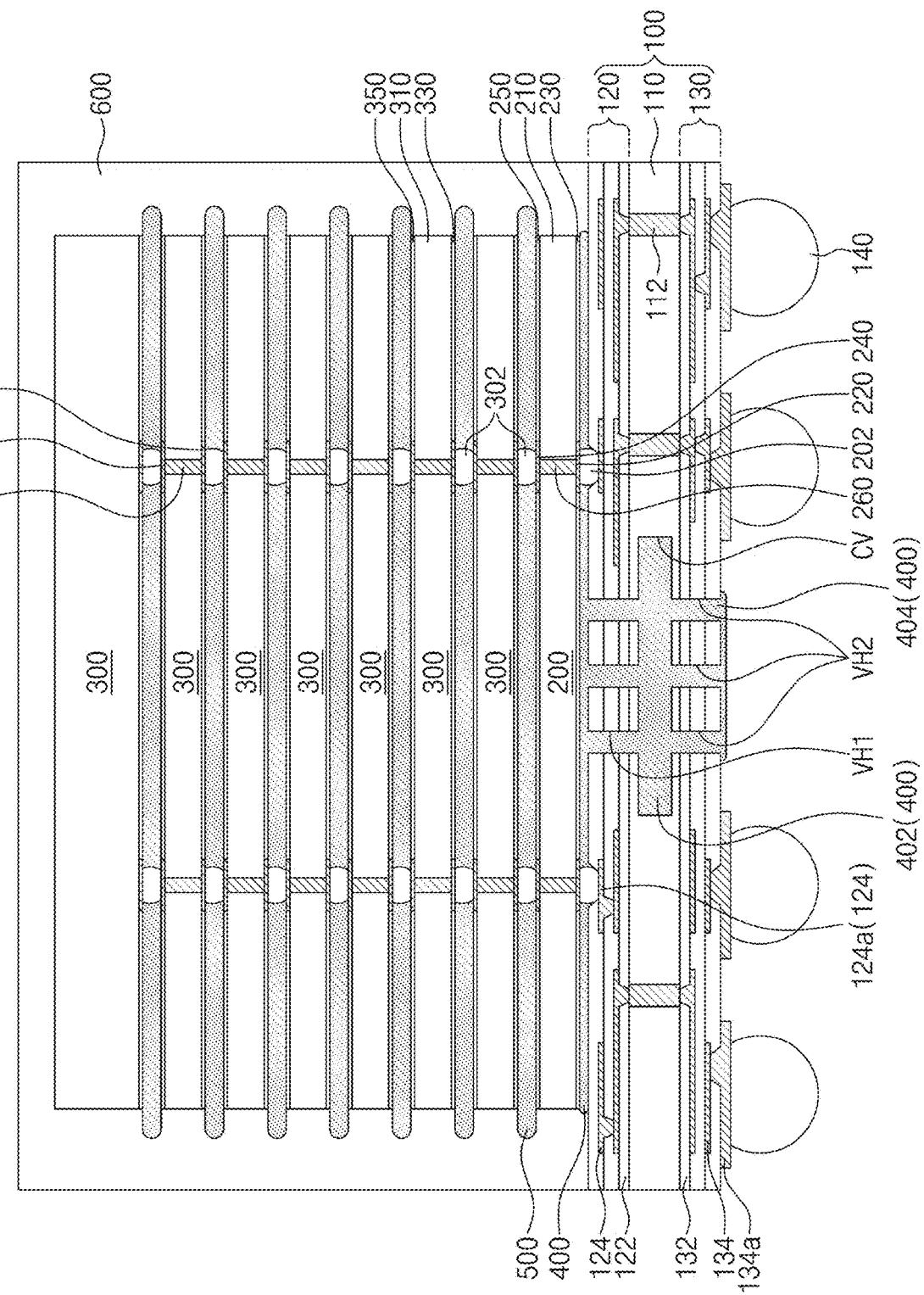

FIGS. 6 and 7 illustrate cross-sectional views showing a semiconductor package according to some example embodiments of inventive concepts. For convenience of explanation, the following description will focus on a difference from that of FIGS. 1 to 5.

Referring to FIG. 6, the package substrate 100 may further include a second vent hole VH2. The second vent hole VH2 may be formed on a lower part of the package substrate 100. When viewed in plan, the second vent hole VH2 may be disposed on the central part of the package substrate 100. For example, the second vent hole VH2 may be placed below the cavity CV. The second vent hole VH2 may extend from the cavity CV to a bottom surface of the package substrate 100. For example, the second vent hole VH2 may be formed to penetrate the lower buildup portion 130 and a portion of the core portion 110. The cavity CV may be spatially connected to outside through the second vent hole VH2. The second vent hole VH2 may have a width D2 of about 2 µm to about 10 µm. The second vent hole VH2 may have an aspect ratio of about 0.1 or higher. The aspect ratio and the width D2 of the second vent hole VH2 may depend on a material of the molding layer 600. FIG. 6 depicts that one second vent hole VH2 is provided, but inventive concepts are not limited thereto.

For example, as shown in FIG. 7, the second vent hole VH2 may be provided in plural. The second vent holes VH2 may all penetrate the lower buildup portion 130 and a portion of the core portion 110, thereby being spatially connected to the cavities CV. The second vent holes VH2 may be disposed spaced apart from each other when viewed in plan, the second vent holes VH2 may be arranged at a regular interval. The second vent holes VH2 may be arranged along a first direction and a second direction that are parallel to the bottom surface of the package substrate 100. In this case, the second vent holes VH2 may constitute a plurality of columns and rows when viewed in plan. For example, the second vent holes VH2 may be arranged in a tetragonal lattice shape. For another example, the second vent holes VH2 may be arranged in a hexagonal lattice shape. Inventive concepts, however, are not limited thereto, and the second vent holes VH2 may be arranged in various shapes.

Referring to FIGS. 6 and 7, the first under-fill layer 400 may extend downwardly from the package substrate 100. For example, the first under-fill layer 400 may have a second extension 404 that extends along the second vent hole VH2 and projects from the first extension 402 in the cavity CV onto the bottom surface of the package substrate 100. The second extension 404 of the first under-fill layer 400 may partially cover the bottom surface of the package substrate 100. In this case, a distance between the bottom surface of the package substrate 100 and a lowermost end of the second extension 404 may be less than a thickness of the external terminal 140.

Figure 8:
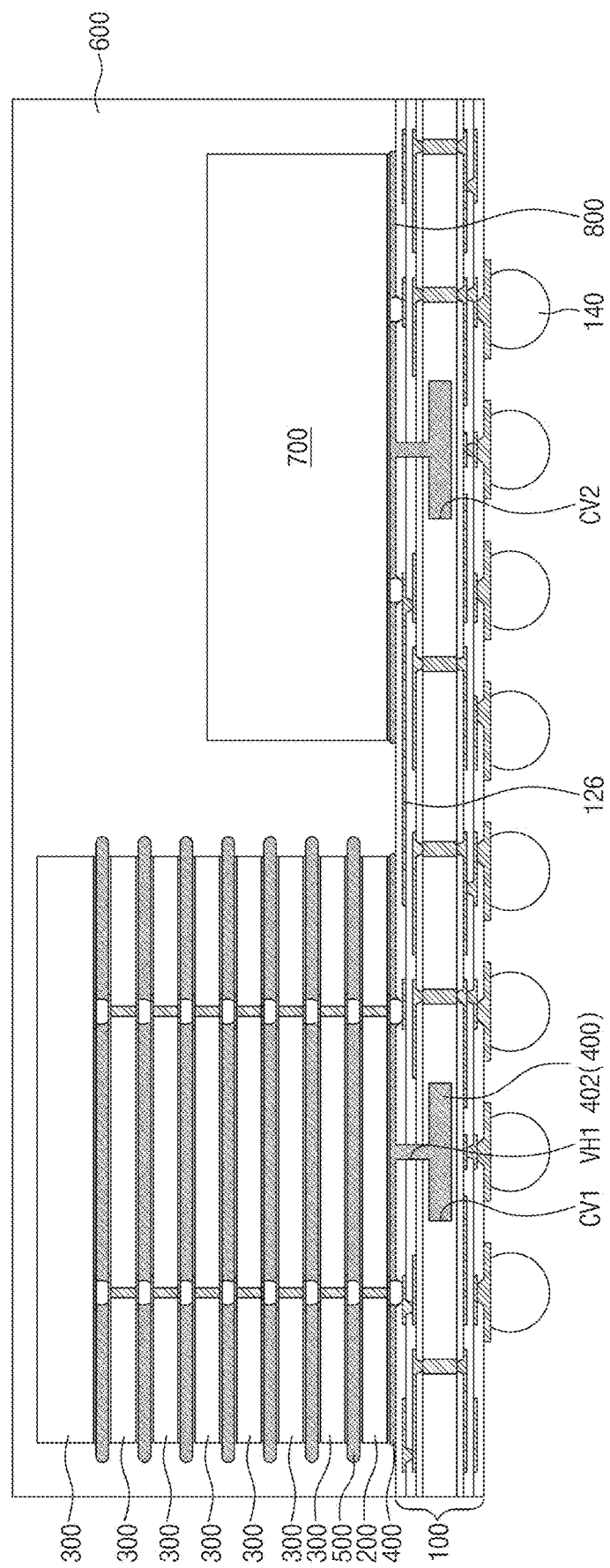
FIG. 8 illustrates a cross-sectional view showing a semiconductor package according to some example embodiments of inventive concepts.

FIG. 8 illustrates a cross-sectional view showing a semiconductor package according to some example embodiments of inventive concepts.

Referring to FIG. 8, a first semiconductor chip 200 and second semiconductor chips 300 may be stacked on a package substrate 100. The package substrate 100 and the first and second semiconductor chips 200 and 300 may be the same as or similar to those discussed with reference to FIG. 1.

A first under-fill layer 400 may be provided between the package substrate 100 and the first semiconductor chip 200, and second under-fill layers 500 may be provided between the second semiconductor chips 300 and between the first semiconductor chip 200 and the second semiconductor chip 300. The first and second under-fill layers 400 and 500 may be the same as those discussed with reference to FIG. 1. For example, the first under-fill layer 400 may have the first extension 402 that fills the first vent hole VH1 and a first cavity CV1.

A third semiconductor chip 700 may be provided on the package substrate 100. The third semiconductor chip 700 and the first semiconductor chip 200 may be spaced apart from each other in a direction parallel to the top surface of the package substrate 100. For example, a spacing distance between the first semiconductor chip 200 and the third semiconductor chip 700 may range from about 50 µm to about 100 µm. The first and third semiconductor chips 200 and 700 may be electrically connected to each other through a circuit line 126 in the upper buildup portion 120 of the package substrate 100. The first and second semiconductor chips 200 and 300 may be memory chips, such as DRAM, SRAM, MRAM, or Flash, and the third semiconductor chip 700 may be a logic chip.

A third under-fill layer 800 may be interposed between the package substrate 100 and the third semiconductor chip 700. The third under-fill layer 800 may fill a space between the package substrate 100 and the third semiconductor chip 700. The third under-fill layer 800 may protrude outwardly from a lateral surface of the third semiconductor chip 700. For example, the third under-fill layer 800 may have a width greater than that of the third semiconductor chip 700. The third under-fill layer 800 may fill a second cavity CV2 formed in the package substrate 100.

FIGS. 9 to 17 illustrate cross-sectional views showing a method of fabricating a semiconductor package according to some example embodiments of inventive concepts.

Figure 9:
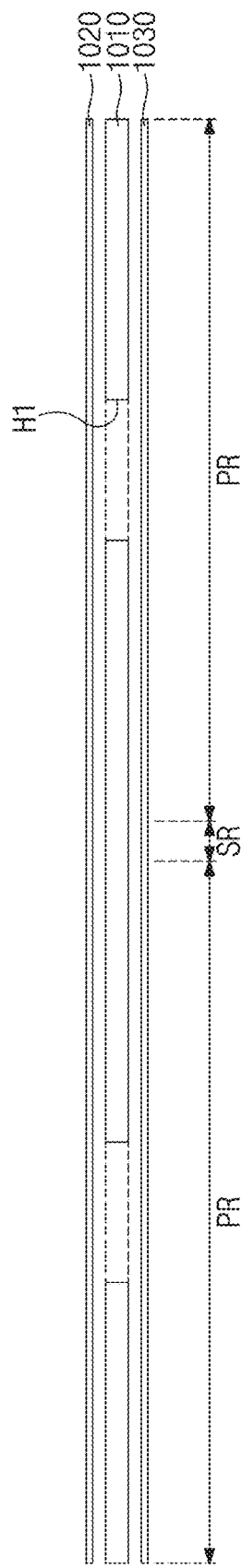

Referring to FIG. 9, there may be provided a first core layer 1010, a second core layer 1020, and a third core layer 1030. The first, second, and third core layers 1010, 1020, and 1030 may be components that constitute the core portion 110 of the package substrate 100 discussed with reference to FIG. 1. The first, second, and third core layers 1010, 1020, and 1030 may each include a dielectric material.

First holes H1 may be formed in the first core layer 1010. The first holes H1 may be formed on corresponding package regions PR. The first holes H1 may be formed to vertically penetrate the first core layer 1010. The package regions PR may be spaced apart from each other across a separation region SR. In this description, the package regions PR may be defined to indicate zones on each of which one semiconductor package is formed, and the separation region SR may be defined to indicate a zone along which a sawing process is performed to divide the formed semiconductor packages from each other.

Figure 10:
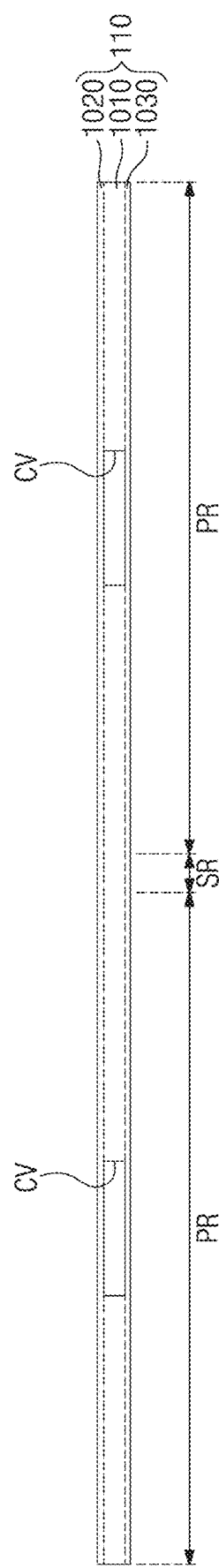

Referring to FIG. 10, the second core layer 1020 may be coupled to a top surface of the first core layer 1010, and the third core layer 1030 may be coupled to a bottom surface of the first core layer 1010. The first, second, and third core layers 1010, 1020, and 1030 may constitute a core portion 110. The first holes H1 of the first core layer 1010 may be surrounded by the first core layer 1010, the second core layer 1020, and the third core layer 1030. The first holes H1 surrounded by the first, second, and third core layers 1010, 1020, and 1030 may constitute cavities CV.

Referring to FIG. 11, vertical connection terminals 112 may be formed in the core portion 110. For example, the vertical connection terminals 112 may be formed by forming holes that penetrate the core portion 110, and then filling the holes with a conductive material. On the package regions PR, the vertical connection terminals 112 may be formed spaced apart from the cavities CV.

An upper buildup portion 120 may be formed on the core portion 110. For example, a dielectric layer may be formed on a top surface of the core portion 110, and then the dielectric layer may be patterned to form an upper dielectric layer 122. The patterning of the upper dielectric layer 122 may expose the vertical connection terminals 112. A conductive layer may be formed on the upper dielectric layer 122, and then the conductive layer may be patterned to form an upper wiring line 124. The formation of the upper dielectric layer 122 and the upper wiring line 124 may be repeatedly performed. A plurality of upper dielectric layers 122 and a plurality of upper wiring lines 124 may constitute the upper buildup portion 120 discussed with reference to FIG. 1. An uppermost one of the upper wiring lines 124 may be buried in the upper dielectric layers 122. The uppermost one of the upper wiring lines 124 may be exposed to a recession formed in an uppermost one of the upper dielectric layers 122.

A lower buildup portion 130 may be formed below the core portion 110. For example, a dielectric layer may be formed on a bottom surface of the core portion 110, and then the dielectric layer may be patterned to form a lower dielectric layer 132. A conductive layer may be formed on the lower dielectric layer 132, and then the conductive layer may be patterned to form a lower wiring line 134. The formation of the lower dielectric layer 132 and the lower wiring line 134 may be repeatedly performed. A plurality of lower dielectric layers 132 and a plurality of lower wiring lines 134 may constitute the lower buildup portion 130 discussed with reference to FIG. 1.

Referring to FIG. 12, first vent holes VH1 may be formed in the package substrate 100. The first vent holes VH1 may be formed by etching the upper buildup portion 120 and a portion of the core portion 110. The first vent holes VH1 may be formed to be spatially connected to the cavities CV. The formation of the first vent holes VH1 may include a drilling process, such as laser drilling. The first vent holes VH1 may be spaced apart from the upper wiring lines 124.

Figure 13:
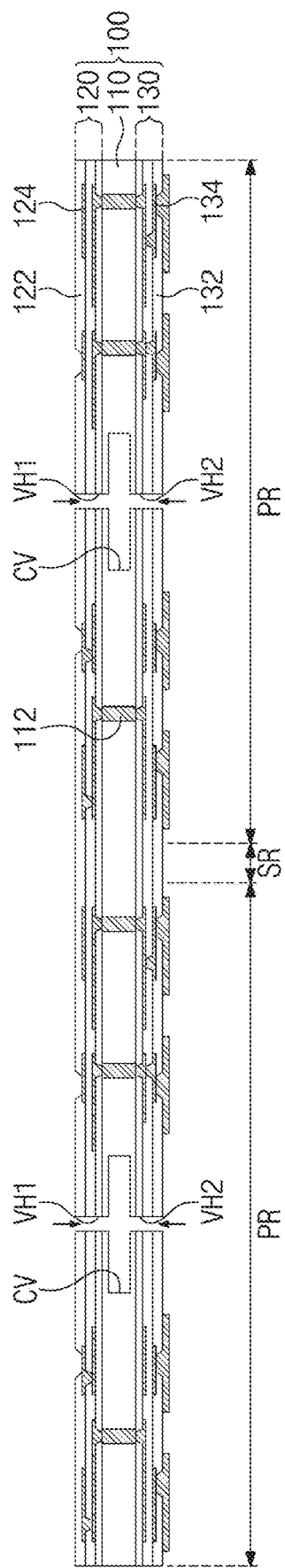

According to some example embodiments, as shown in FIG. 13, second vent holes VH2 may be additionally formed in the package substrate 100. The second vent holes VH2 may be formed by etching the lower buildup portion 130 and a portion of the core portion 110. The second vent holes VH2 may be formed to be spatially connected to the cavities CV.

The formation of the second vent holes VH2 may be performed simultaneously with or separately from the formation of the first vent holes VH1. The formation of the second vent holes VH2 may include a drilling process. As shown in FIG. 13, when the second vent holes VH2 are formed in the package substrate 100, a semiconductor package may be fabricated as discussed in FIG. 6. The following will focus on the embodiment of FIG. 12.

Figure 14:
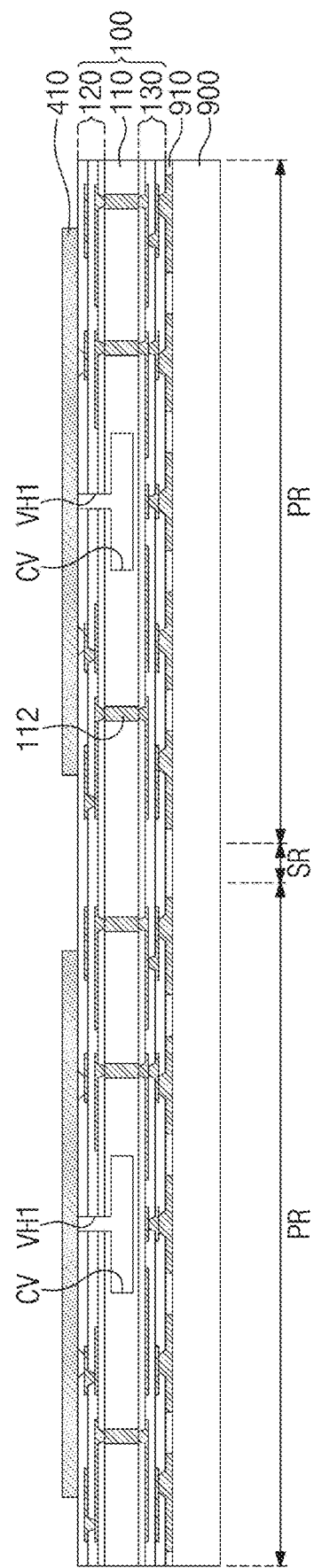

Referring to FIG. 14, the package substrate 100 may be provided on a carrier substrate 900. The package substrate 100 may be attached to the carrier substrate 900. For example, as shown in figures, the carrier substrate 900 may include an adhesive member 910 provided on a top surface thereof. For another example, the carrier substrate 900 may include an adhesive tape 910.

First under-fill members 410 may be provided on the package substrate 100. For example, the first under-fill members 410 may be non-conductive adhesives or non-conductive films. When the first under-fill members 410 are non-conductive adhesives, the first under-fill members 410 may be formed by a dispensing method in which the package substrate 100 is coated with liquid non-conductive adhesives. When the first under-fill members 410 are non-conductive films, the first under-fill members 410 may be formed by attaching non-conductive films to the package substrate 100. The first under-fill members 410 may be provided on the package regions PR of the package substrate 100. For example, the first under-fill members 410 may be positioned above the cavities CV while covering the first vent holes VH1. The first under-fill members 410 may be spaced apart from the separation region SR.

Figure 15:
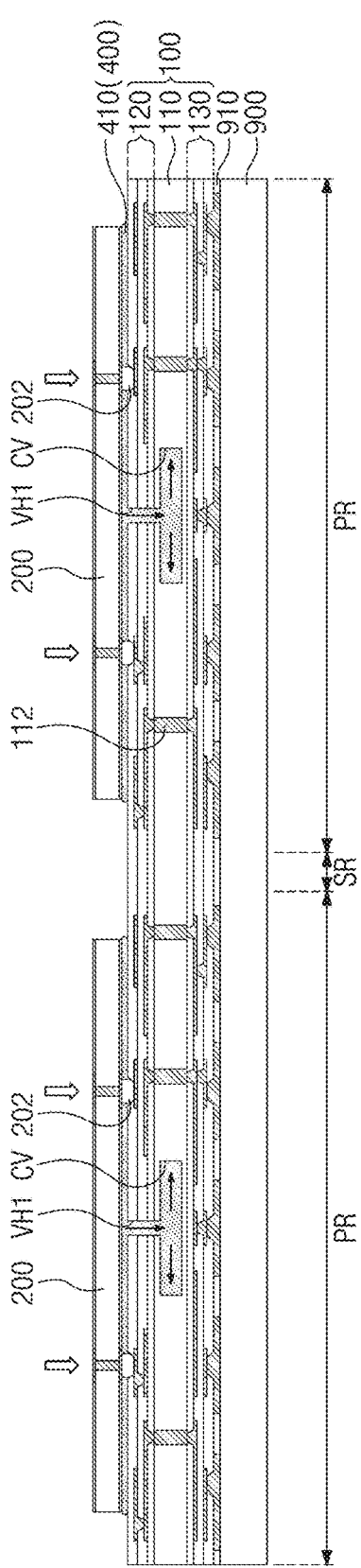

Referring to FIG. 15, a thermocompression bonding may be performed to couple first semiconductor chips 200 to the package substrate 100. The first semiconductor chips 200 may be electrically connected to the package substrate 100 through first connection terminals 202. For example, the first connection terminals 202 may be coupled to the upper wiring lines 124 provided in the recessions of the upper buildup portion 120. Therefore, a small interval may be provided between the package substrate 100 and the first semiconductor chips 200. When the first semiconductor chips 200 are compressed in a direction toward the package substrate 100, the first under-fill members 410 may protrude outwardly from lateral surfaces of the first semiconductor chips 200. In addition, as designated by arrows shown in FIG. 15, the first under-fill members 410 may pass through the first vent holes VH1 to fill the cavities CV. The compressed first under-fill members 410 may constitute first under-fill layers 400. As the first under-fill members 410 are introduced into the cavities CV, the first under-fill members 410 may each protrude a small distance outwardly from the lateral surface of the first semiconductor chip 200. Therefore, none of the first under-fill members 410 may protrude to the separation region SR, and the occurrence of defects may be reduced in a subsequent sawing process.

Figure 16:
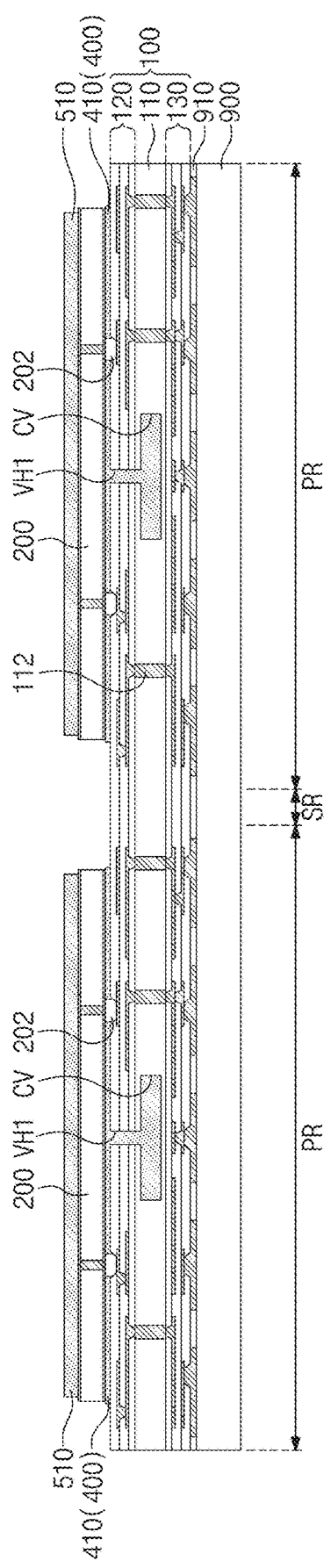

Referring to FIG. 16, second under-fill members 510 may be provided on the first semiconductor chips 200. For example, the second under-fill members 510 may be non-conductive adhesives or non-conductive films. When the second under-fill members 510 are non-conductive adhesives, the second under-fill members 510 may be formed by a dispensing method in which the first semiconductor chips 200 are coated with liquid non-conductive adhesives. When the second under-fill members 510 are non-conductive films, the second under-fill members 510 may be formed by attaching non-conductive films to the first semiconductor chips 200.

Figure 17:
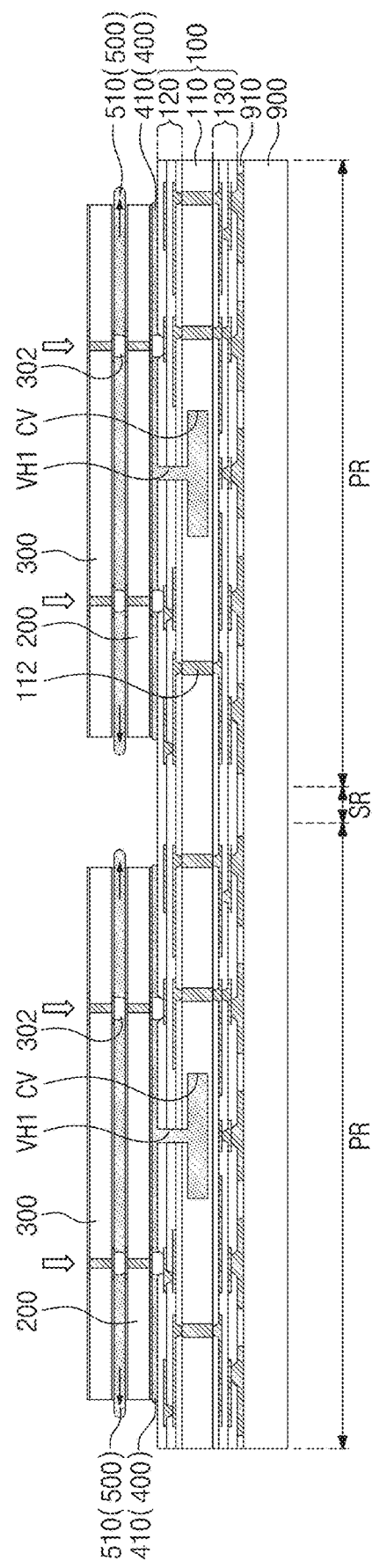

Referring to FIG. 17, a thermocompression bonding may be performed to couple second semiconductor chips 300 to the first semiconductor chips 200. The second semiconductor chips 300 may be electrically connected to the first semiconductor chips 200 through second connection terminals 302. For example, the second connection terminals 302 may be coupled to second chip pads 240 of the first semiconductor chips 200. When the second semiconductor chips 300 are compressed in a direction toward the first semiconductor chips 200, as designated by arrows shown in FIG. 17, the second under-fill members 510 may protrude outwardly from lateral surfaces of the second semiconductor chips 300. The compressed second under-fill members 510 may constitute second under-fill layers 500. A protrusion distance of the second under-fill member 510 outwardly from the lateral surface of the second semiconductor chip 300 may be greater than a protrusion distance of the first under-fill member 410 outwardly from the lateral surface of the first semiconductor chip 200. A distance between the first semiconductor chips 200 and the second semiconductor chips 300 may be less than a distance between the package substrate 100 and the first semiconductor chips 200.

Figure 18:
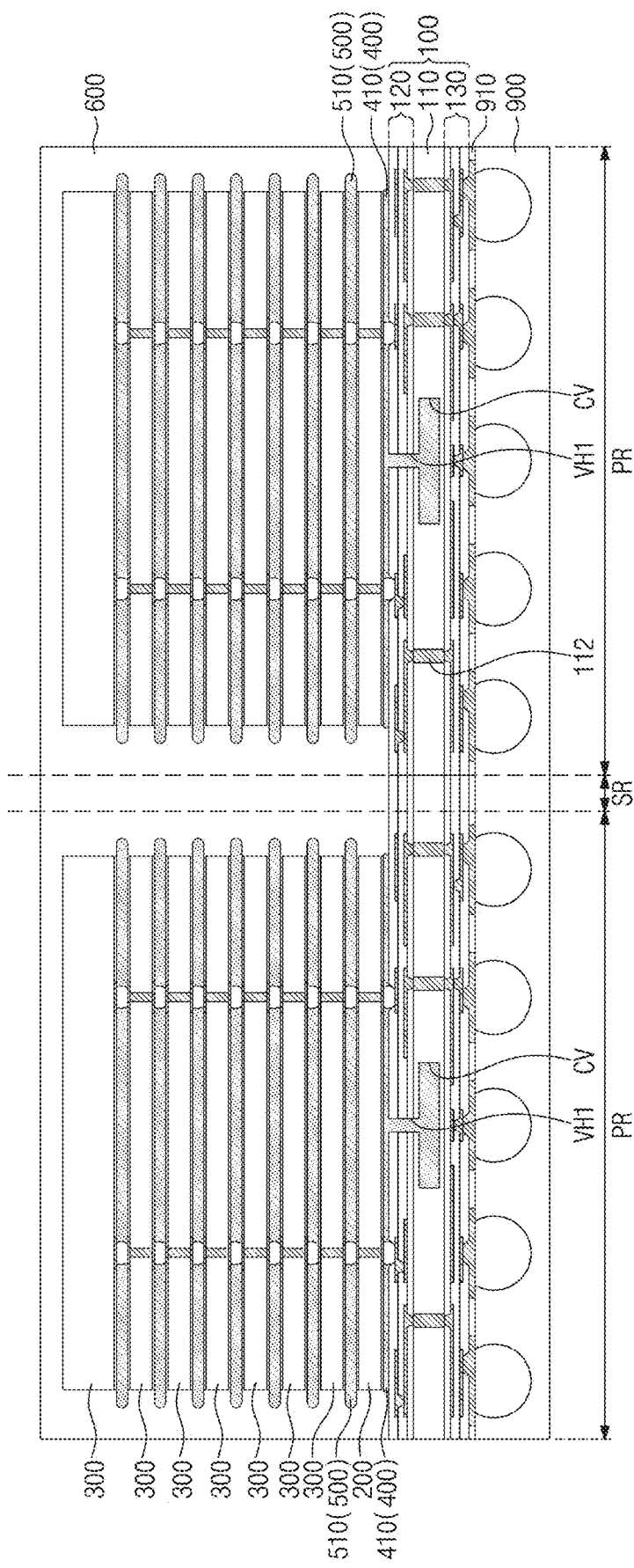

Referring to FIG. 18, other second semiconductor chips 300 may be stacked. The stacking process of the second semiconductor chips 300 may be the same as that discussed with reference to FIGS. 16 and 17.

A molding layer 600 may be formed on the package substrate 100. For example, the package substrate 100 may be provided on its top surface with a dielectric material that surrounds the first and second semiconductor chips 200 and 300, and then the dielectric material may be cured to form the molding layer 600. The dielectric material may include a dielectric polymer or a thermosetting resin.

Afterwards, a singulation process such as a sawing process may be performed to form semiconductor packages. The sawing process may be executed on the separation region SR. Therefore, the first semiconductor chips 200 may be separated from each other, and a plurality of semiconductor packages may be formed.

When the cavities CV are not formed in the package substrate 100, the first under-fill members 410 may be provided in a small interval between the package substrate 100 and the first semiconductor chips 200, and may each protrude a large distance outwardly from the lateral surface of the first semiconductor chip 200. For example, because a distance between the first semiconductor chips 200 and the second semiconductor chips 300 is less than a distance between the package substrate 100 and the first semiconductor chips 200, a protrusion distance of the first under-fill member 410 may be greater than a protrusion distance of the second under-fill member 510. In this case, the first under-fill layers 400 may be formed adjacent to the separation region SR, and defects such as delamination of the molding layer 600 may occur in a subsequent sawing process.

According to some example embodiments of inventive concepts, as the first under-fill members 410 are introduced into the cavities CV, the first under-fill members 410 may each protrude a small distance outwardly from the lateral surface of the first semiconductor chip 200. As a result, none of the first under-fill members 410 may protrude to the separation region SR, and the occurrence of defects may be reduced in a sawing process.

Referring back to FIG. 1, the carrier substrate 900 may be removed. For example, the carrier substrate 900 may be removed by applying a shear stress or by chemically treating the adhesive member 910. The removal of the carrier substrate 900 may expose a bottom surface of the package substrate 100. External terminals 140 may be formed on the exposed bottom surface of the package substrate 100.

The process mentioned above may fabricate the semiconductor package shown in FIG. 1.

FIGS. 19 to 22 illustrate cross-sectional views showing a method of fabricating a semiconductor package according to some example embodiments of inventive concepts.

Figure 19:
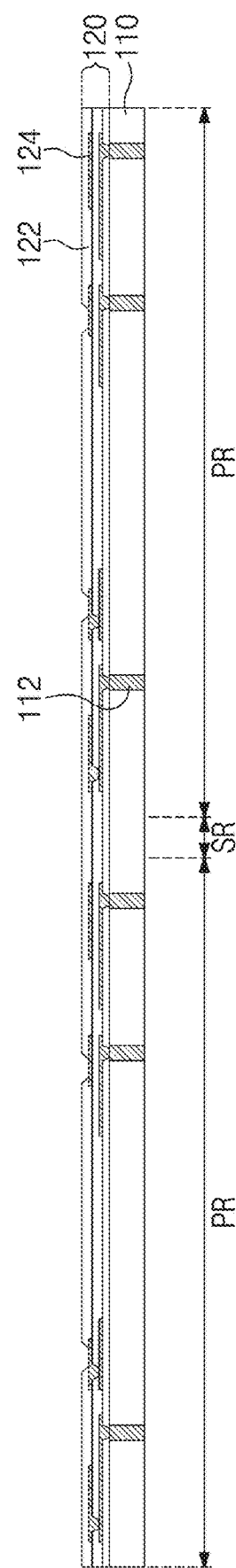

Referring to FIG. 19, a core portion 110 may be provided. Vertical connection terminals 112 may be formed in the core portion 110. For example, the vertical connection terminals 112 may be formed by forming holes that penetrate the core portion 110 on package regions PR, and then filling the holes with a conductive material.

An upper buildup portion 120 may be formed on the core portion 110. For example, a dielectric layer may be formed on a top surface of the core portion 110, and then the dielectric layer may be patterned to form an upper dielectric layer 122. A conductive layer may be formed on the upper dielectric layer 122, and then the conductive layer may be patterned to form an upper wiring line 124. The formation of the upper dielectric layer 122 and the upper wiring line 124 may be repeatedly performed. A plurality of upper dielectric layers 122 and a plurality of upper wiring lines 124 may constitute the upper buildup portion 120 discussed with reference to FIG. 1.

Figure 20:
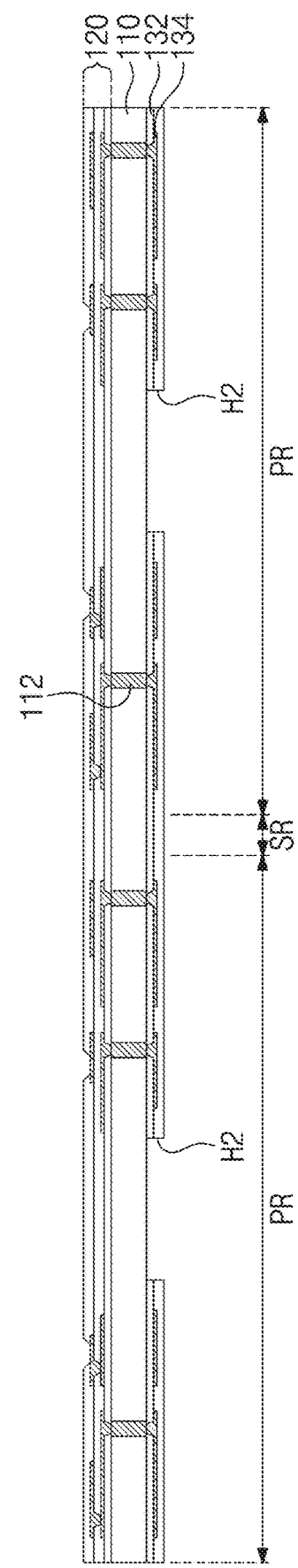

Referring to FIG. 20, a dielectric layer may be formed on a bottom surface of the core portion 110, and then the dielectric layer may be patterned to form a lower dielectric layer 132. A conductive layer may be formed on the lower dielectric layer 132, and then the conductive layer may be patterned to form a lower wiring line 134. The formation of the lower dielectric layer 132 and the lower wiring line 134 may be repeatedly performed.

Second holes H2 may be formed in the lower dielectric layers 132. The second holes H2 may be formed on corresponding package regions PR. The second holes H2 may be formed to vertically penetrate the lower dielectric layers 132. The second holes H2 may be spaced apart from the lower wiring lines 134.

Referring to FIG. 21, additional lower dielectric layers 132 and additional lower wiring lines 134 may further be formed on a bottom surface of the package substrate 100. The additional lower dielectric layers 132 may cover the second holes H2. Therefore, the second holes H2 may be surrounded by the lower dielectric layers 132. The second holes H2 surrounded by the lower dielectric layers 132 may constitute cavities CV'.

Referring to FIG. 22, first vent holes VH1 may be formed in the package substrate 100. The first vent holes VH1 may be formed by etching the upper buildup portion 120 and a portion of the core portion 110. The first vent holes VH1 may be formed to be spatially connected to the cavities CV'. The formation of the first vent holes VH1 may include a drilling process, such as laser drilling. The first vent holes VH1 may be spaced apart from the upper wiring lines 124.

After that, processes discussed with reference to FIGS. 14 to 18 may be performed to fabricate the semiconductor package of FIG. 2.

In a semiconductor package according to some example embodiments of inventive concepts, a small distance may be between a first semiconductor chip and a package substrate, and thus it may be possible to provide the semiconductor package with reduction in height and with advantage of decrease in size. In addition, a small width may be provided to an under-fill layer, and a large contact area may be provided between a molding layer and the package substrate. Accordingly, the molding layer and the package substrate may have a strong adhesive force therebetween, and the semiconductor package may increase in structural stability.

In a method of fabricating a semiconductor package according to some example embodiments of inventive concepts, under-fill members may be introduced into cavities of a package substrate, and thus the under-fill members may each protrude a small distance outwardly from a lateral surface of a semiconductor chip. Therefore, the under-fill members may not protrude to a separation region, and the occurrence of defects may be reduced in a sawing process.

Although inventive concepts have been described in connection with some example embodiments of inventive concepts illustrated in the accompanying drawings, it will be understood by one of ordinary skill in the art that variations in form and detail may be made therein without departing from the spirit and features of inventive concepts. Therefore, the above disclosed embodiments should thus be considered illustrative and not restrictive.

What is claimed is:

1. A semiconductor package, comprising:
   a package substrate;
   a cavity in the package substrate;
   a first vent hole extending from a top surface of the package substrate to the cavity such that the first vent hole is in fluid communication with the cavity;
   a second vent hole extending from a bottom surface of the package substrate to the cavity such that the second vent hole is in fluid communication with the cavity;
   a first semiconductor chip mounted on the package substrate;
   a second semiconductor chip mounted on the first semiconductor chip; and
   a first under-fill layer filling a space between the package substrate and the first semiconductor chip,
   wherein the first under-fill layer extending along the first vent hole, the cavity, and the second vent hole onto the bottom surface of the package substrate, and
   wherein a width of the cavity is greater than a width of the first vent hole and a width of the second vent hole.

2. The semiconductor package of claim 1, wherein the first under-fill layer extending from the space between the package substrate and the first semiconductor chip along the first vent hole to fill the cavity.

3. The semiconductor package of claim 1, wherein the width of the cavity is less than a width of the first semiconductor chip.

4. The semiconductor package of claim 1, further comprising:
   a second under-fill layer filling a space between the first semiconductor chip and the second semiconductor chip, wherein
   a width of the first under-fill layer between the package substrate and the first semiconductor chip is the same as or less than a width of the second under-fill layer between the first semiconductor chip and the second semiconductor chip.

5. The semiconductor package of claim 4, wherein a protrusion distance of the second under-fill layer outwardly from a lateral surface of the second semiconductor chip is greater than a protrusion distance of the first under-fill layer outwardly from a lateral surface of the first semiconductor chip.

6. The semiconductor package of claim 1, wherein
   the first vent hole is one of a plurality of first vent holes included in the package substrate, and the plurality of first vent holes are arranged along a first direction and a second direction that are parallel to the top surface of the package substrate.

7. The semiconductor package of claim 1, wherein
the second vent hole is one of a plurality of second vent holes included in the package substrate, and
the plurality of second vent holes are arranged along a first direction and a second direction that are parallel to the top surface of the package substrate.

8. The semiconductor package of claim 1, wherein each of the width of the first vent hole and the width of the second vent hole are in a range of about 2 μm to about 10 μm.

9. The semiconductor package of claim 1, wherein
the package substrate includes a core portion, a first buildup portion, and a second buildup portion,
the first buildup portion and the second buildup portion are respectively on an upper surface and a bottom surface of the core portion,
each of the first buildup portion and the second buildup portions include a plurality of dielectric layers and a plurality of wiring lines that are alternately stacked, and
the cavity is in the core portion.

10. The semiconductor package of claim 9, wherein
the first vent hole is in the first buildup portion, and
the second vent hole is in the second buildup portion.

11. The semiconductor package of claim 1, wherein a distance between the package substrate and the first semiconductor chip is less than a distance between the first semiconductor chip and the second semiconductor chip.

12. The semiconductor package of claim 1, wherein
the package substrate includes a plurality of substrate pads in a plurality of recessions on the top surface of the package substrate,
the plurality of substrate pads are exposed on the top surface of the package substrate,
the package substrate includes a plurality of connection terminals, and
the first semiconductor chip is coupled to the plurality of substrate pads through the plurality of connection terminals.

13. The semiconductor package of claim 1, wherein
each of the first semiconductor chip and the second semiconductor chip includes:
a base layer having an integrated circuit formed therein;
a chip pad on a bottom surface of the base layer; and
a through electrode that vertically penetrates the base layer and is connected to the chip pad.

14. A semiconductor package, comprising:
a package substrate including a cavity therein;
a first semiconductor chip mounted on the package substrate;
a second semiconductor chip mounted on a top surface of the first semiconductor chip;
a first under-fill layer filling a space between the package substrate and the first semiconductor chip, the first under-fill layer penetrates the package substrate and the cavity to extend onto a bottom surface of the package substrate, and the first under-fill layer fills the cavity;
a second under-fill layer filling a space between the first semiconductor chip and the second semiconductor chip; and
a molding layer on the package substrate, the molding layer surrounding the first semiconductor chip and the second semiconductor chip,
wherein a width of the first under-fill layer between the package substrate and the first semiconductor chip being less than a width of the second under-fill layer between the first semiconductor chip and the second semiconductor chip, and
wherein each of the first semiconductor chip and the second semiconductor chips includes:
a base layer having an integrated circuit formed therein;
a chip pad on a bottom surface of the base layer; and
a through electrode that vertically penetrates the base layer and is connected to the chip pad.

15. The semiconductor package of claim 14, wherein
the package substrate further includes a first vent hole that extends from the cavity to a top surface of the package substrate, and a second vent hole that extends from the cavity to a bottom surface of the package substrate,
the first under-fill layer along the first vent hole, the cavity, and the second vent hole onto the bottom surface of the package substrate.

16. The semiconductor package of claim 15, wherein
the first vent hole is one of a plurality of first vent holes included in the package substrate, and the plurality of first vent holes are arranged along a first direction and a second direction that are parallel to the top surface of the package substrate, and
the second vent hole is one of a plurality of second vent holes included in the package substrate, and the plurality of second vent holes are arranged along a first direction and a second direction that are parallel to the top surface of the package substrate.

17. The semiconductor package of claim 14, wherein the package substrate includes a core portion, a first buildup portion on a top surface of the core portion, and a second buildup portion on a bottom surface of the core portion.

18. The semiconductor package of claim 14, wherein the cavity is in a core portion of the package substrate.

19. The semiconductor package of claim 14, wherein a protrusion distance of the second under-fill layer outwardly from a lateral surface of the second semiconductor chip is greater than a protrusion distance of the first under-fill layer outwardly from a lateral surface of the first semiconductor chip.

20. The semiconductor package of claim 14, wherein a distance between the package substrate and the first semiconductor chip is less than a distance between the first semiconductor chip and the second semiconductor chip.

* * * * *